Jan. 17, 1967 A. E. WOLFRAM 3,299,360

ULTRA HIGH FREQUENCY CONVERTER

Filed March 22, 1963

INVENTOR:
ADOLF E. WOLFRAM,

BY Frank J. Thompson
HIS ATTORNEY.

United States Patent Office 3,299,360
Patented Jan. 17, 1967

3,299,360

ULTRA HIGH FREQUENCY CONVERTER

Adolf E. Wolfram, Jamesville, N.Y., assignor to General Electric Company, a corporation of New York Filed Mar. 22, 1963, Ser. No. 267,207
2 Claims. (Cl. 325—436)

This invention relates to ultra high frequency converters and more particularly to a means for reducing radiation of electrical energy therefrom.

Ultra high frequency converters are adapted for selectively tuning signal channels in a relatively high frequency range. For example, a UHF converter which is suitable for use with a television receiver is required to tune signal channels in the presently allocated 470 mc.–890 mc. band. Because of the relatively high frequency of operation, the radiation of interfering electrical energy from the converter is a common and serious problem. The present day trend toward miniaturization of converters has aggravated the problem due to increased stray couplings which result from a necessarily closer spacing of components.

Electrical suppression components having a fixed electrical characteristic have been provided for reducing the radiation. However, the addition of these components is not beneficial for a miniaturization of the converter and increases the cost of fabricating the converter. Furthermore, as indicated hereinafter, suppression components having fixed electrical characteristics cannot be utilized at all of the critical points of stray coupling and radiation in the converter.

Accordingly, it is an object of this invention to provide improved means for reducing radiation from a UHF converter.

Another object of this invention is to provide a relatively inexpensive radiation reduction arrangement for a UHF converter.

Another object of this invention is to provide a radiation reduction arrangement for a UHF converter which avoids the necessity for providing additional components.

A further object of this invention is to provide in a UHF converter a radiation reduction arrangement which is compatible with a desired miniaturization of the converter.

UHF converters comprise a radio frequency stage having an antenna coupling and a variable tuning circuit arrangement for selectively tuning a desired signal channel, an oscillator stage for generating a variable frequency signal to be heterodyned with the selected RF signal, and a mixer stage for heterodyning the tuned RF signal and the oscillator signal to provide a sum or difference frequency signal. The oscillator, which is the only active stage for generating alternating signals in the converter, constitutes a source of relatively high level A.C. energy. Thus, although other spurious frequencies may be radiated, the higher radiation levels from the converter are generally at the fundamental or harmonic of the oscillator frequency.

These high levels of oscillator frequency radiation are generally transmitted from the signal receiving antenna. Undesirable stray couplings between the oscillator stage and the radio frequency stage couple oscillator frequency energy to the radio frequency stage and then to the antenna from which it is radiated. Filter circuit arrangements of components having fixed electrical characteristics cannot be utilized for suppressing oscillator frequencies in the radio frequency stage, since the filter would interfere with signal channel reception, unless an extremely large sum or difference frequency signal is provided.

For reducing radiation of oscillator frequencies from the antenna, the art has primarily relied upon a mutual shielding and spacing apart of the oscillator and radio frequency stages. In one type of converter, a plurality of metal plates compartmentize and shield the different stages. Nevertheless, substantial stray coupling exists between the oscillator and radio frequency stages. This coupling occurs since both stages must feed signals to a common circuit, the mixer stage. In particular, a pick-up loop is generally provided and couples oscillator energy from the oscillator stage to a mixer element in the mixer stage. Significant inductive and capacitive coupling inevitably exists between the pick-up loop and a means which is provided for coupling the selected RF signal to the element.

Therefore, it is another object of this invention to provide an improved arrangement for reducing radiation of electrical energy originating in the oscillator stage.

Another object of this invention is to provide an arrangement for reducing radiation of energy from the antenna which originates in the oscillator stage.

A further object of the present invention is to provide an arrangement for reducing stray couplings between the oscillator and radio frequency stages.

Still another object of this invention is to provide an inexpensive arrangement for reducing radiation of oscillator frequency energy from the antenna.

In accordance with the present invention, a UHF converter is provided having oscillator, mixer and radio frequency stages. A metal plate having an aperture therein is provided and is positioned between the oscillator stage and other stages of the converter. Means couple oscillator frequency energy from the oscillator to a mixing element of the mixer stage. The mixing element is positioned with respect to the aperture in a manner for providing conduction of oscillator frequency energy to the mixer stage while inhibiting stray couplings between the oscillator frequency energy coupling means and other components of the converter.

Further objects, features, and the attending advantages of the invention will be apparent with reference to the following specifications and drawings in which.

Figure 1:
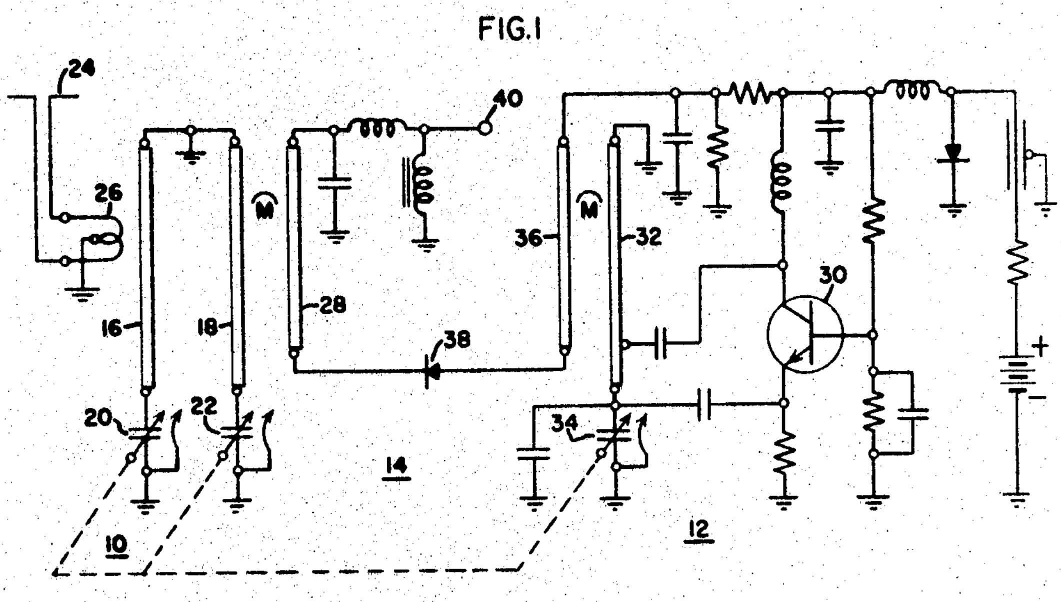
FIGURE 1 is a circuit diagram of a UHF converter arrangement.

A brief description of a UHF converter circuit arrangement which may suitably embody the present invention will now be given with reference to FIGURE 1. Only so much of the circuit of FIGURE 1 will be described as is believed necessary for a complete understanding of the present invention. For a more detailed description of the circuit, reference is made to copending application Serial No. 248,522 which was filed on December 31, 1962, and which is assigned to the assignee of the present invention.

The converter comprises a radio frequency stage 10, an oscillator stage 12, and a mixer stage 14. Included in the radio frequency stage is a double-tuned signal channel selecting network comprising transmission lines 16 and 18 which are tuned by adjustable capacitors 20 and 22 respectively. A broadcast signal being tuned is induced in an antenna 24 and coupled to the transmission line 16 by an antenna coupling loop 26. The tuned signal is further inductively coupled to transmission line 18 and in turn to a transmission line 28 in the mixer stage. A transistor amplifying device 30 is provided for the oscillator stage 12 and is arranged in a variable frequency oscillator circuit configuration. The oscillator generates a range of frequencies which are adjustably selected by means including a transmission line 32 and a variable capacitor 34. An oscillator signal is generated across the transmission line 32 and is inductively coupled to a transmission line 36 of the mixer stage 14. In addition to the transmission lines 28 and 36, the mixer stage includes a mixer element comprising a diode 38. The inductively coupled RF and oscillator signals are heterodyned in the mixer stage to provide a desired sum or difference frequency signal at output terminal 40.

Figure 2:
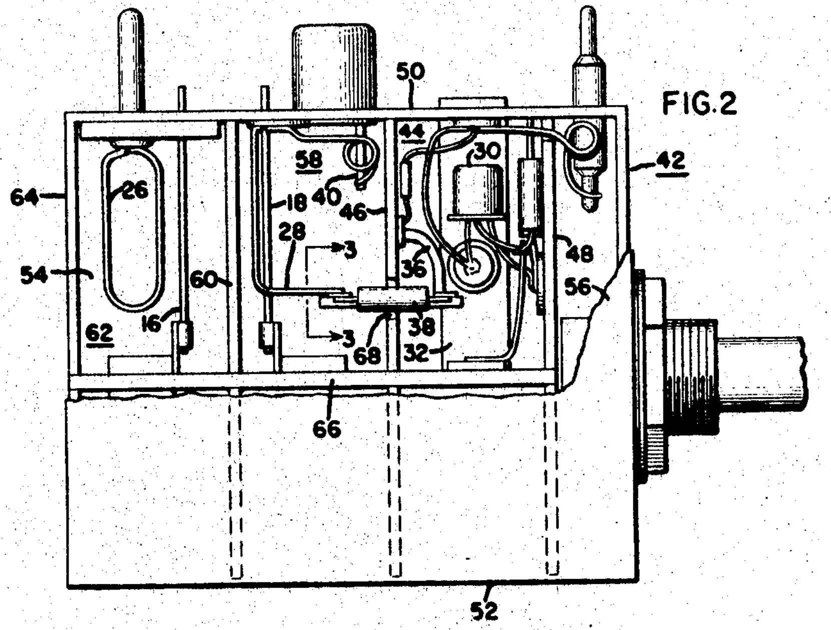
FIGURE 2 is a diagram of a UHF converter having a partly cut-away cover portion exposing the mounting of many of the components of the circuit of FIGURE 1 and illustrating one embodiment of the invention.

The physical arrangement, in a converter enclosure 42, of many of the components of the circuit of FIGURE 1 is illustrated in FIGURE 2. A compartment 44, which is enclosed by metallic separator plates 46 and 48, side walls 50 and 52 and bottom and top covers 54 and 56, houses the oscillator stage 12. Similarly, a compartment 58 formed by a separator plate 60 and plate 46 along with side walls 50, 52 and covers 54, 56 houses the mixer stage 14 and a portion of the radio frequency stage 10, while a compartment 62 formed by a side wall 64, plate 60 along with side walls 50, 52 and covers 54, 56 houses a remaining portion of the radio frequency stage 10. An insulating strip 66 for mounting stator segments of the capacitors 20, 22 and 34, not shown, extends through the compartments. The separator plate 46, which includes an aperture 68, shields the oscillator stage 12 from other stages of the converter.

In prior arrangements, a pick-up loop represented by the line 36 and which structurally may consist of an integral lead of the mixer element, extended from the compartment 44 through an aperture in plate 46 and into the compartment 58 for providing A.C. coupling of oscillator frequency energy to the mixer element. Mixed couplings between the loop and the line 18, for example, operated to undesirably couple oscillator energy to the radio frequency stage 10 and to the antenna 24.

Figure 3:
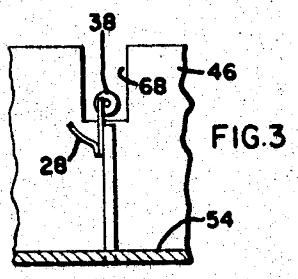
FIGURE 3 is a view taken along section 3—3 of FIGURE 2.

In accordance with a feature of the present invention, the mixer element is positioned with relation to the aperture 68 for providing conduction of oscillator frequency energy to the mixer compartment while reducing undesired mixed couplings between the pick-up loop 36 and other components in the mixer and diode stages of the converter. The body of the diode 38, as indicated in FIGURES 2 and 3, is shown partly positioned in the aperture 68 of the plate 46. Thus, the loop 36, whose function is to couple oscillator energy from line 32 to diode 38 is positioned within the compartment 44. The reduction in oscillator frequency radiation resulting from this arrangement is substantial.

The reduction in radiation may be attributed in a large measure to the fact that the transmission line 36, which carries a relatively high level of oscillator frequency energy, is positioned within the oscillator compartment. The plate 46 thereby operates to shield undesired coupling of oscillator energy from the loop 36 to other components in the mixer and radio frequency stages. Further, oscillator frequency energy which is conductively coupled into the mixer compartment is attenuated by the impedance of the diode. Thus, not only is the higher energy level loop 36 shielded from the components 58 but, in addition, a lower level of oscillator energy is coupled into the compartment 58 than was heretofore provided. Although the aperture 68 may allow some small radiation of oscillator energy between compartments 44 and 58, the aperture can be made sufficiently small for minimizing the radiation while the body of the diode will itself, to some extent, block this radiation. The net result is a decrease in the radiation of oscillator energy from the compartment 44 and thus from the antenna 24.

Various modifications of the arrangement of the diode 38 as illustrated in FIGURE 2 may be made without departing from the spirit of this invention. For example, although the body of the diode is shown partly positioned in the aperture 68 of the plate 46, the diode may be otherwise positioned in a manner for advantageously utilizing the shielding affect of plate 46 for shielding the coupling of oscillator energy from the line 36 to other components of the converter.

Thus, I have described a relatively uncomplex and inexpensive arrangement which avoids adding radiation suppression components to the converter yet which substantially reduces the radiation level therefrom.

While I have illustrated and described and have pointed out in the annexed claims certain novel features of my invention, it will be understood that various omissions, substitutions and changes in the forms and details of the system illustrated may be made by those skilled in the art without departing from the spirit of the invention and the scope of the claims.

What I claim as new and desire to secure by Letters Patent of the United States is:

1. In an ultra high frequency converter an arrangement for reducing undesired radiation therefrom comprising:
   a converter having an enclosure and including oscillator, mixer and radio frequency stages positioned therein,
   a metal plate positioned between said oscillator stage and a portion of said mixer stage, said plate having an aperture therein,
   said mixer stage including a diode having a pair of electrodes and a pick-up element, said pick-up element having one end thereof connected to one of said electrodes of said diode to form a series circuit therewith, said one electrode of said diode and said pick-up element lying entirely on the oscillator side of said plate,
   said diode extending through said aperture and the other electrode of said diode lying entirely on the other side of said plate.

2. An ultra high frequency converter arrangement for reducing undesired radiation therefrom comprising:
   a converter having an enclosure and including oscillator, mixer and radio frequency stages positioned therein,
   a metal plate positioned between said oscillator stage and a portion of said mixer stage, said plate having an aperture therein,
   said mixer stage including a diode having a pair of electrodes and a pick-up loop, said pick-up loop having an end thereof connected to one of said electrodes of said diode to form a series circuit therewith,
   said one electrode and said pick-up loop lying entirely on the oscillator side of said plate,
   said diode extending through said aperture and the other electrode of said diode lying on the other side of said plate, said diode having a body portion, said body portion extending into said aperture.

References Cited by the Examiner

UNITED STATES PATENTS 3,181,069 4/1965 Eland ----------- 325—357 X

KATHLEEN H. CLAFFY, *Primary Examiner*.

R. S. BELL, *Assistant Examiner*.